(12) United States Patent
Kung et al.

(10) Patent No.: US 11,756,896 B2
(45) Date of Patent: Sep. 12, 2023

(54) SEMICONDUCTOR PACKAGE STRUCTURE INCLUDING SHIELDING LAYER CONTACTING CONDUCTIVE CONTACT

(71) Applicant: Advanced Semiconductor Engineering, Inc., Kaohsiung (TW)

(72) Inventors: Cheng-Yuan Kung, Kaohsiung (TW); Meng-Wei Hsieh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 181 days.

(21) Appl. No.: 17/111,347

(22) Filed: Dec. 3, 2020

(65) Prior Publication Data

US 2022/0181267 A1   Jun. 9, 2022

(51) Int. Cl.
*H01L 23/552* (2006.01)
*H01L 21/56* (2006.01)
*H01L 23/538* (2006.01)
*H01L 23/00* (2006.01)

(52) U.S. Cl.
CPC ............ *H01L 23/552* (2013.01); *H01L 21/56* (2013.01); *H01L 23/5389* (2013.01); *H01L 24/32* (2013.01); *H01L 2224/32227* (2013.01)

(58) Field of Classification Search
CPC ....... H01L 23/31; H01L 23/552; H01L 21/56; H01L 23/5389; H01L 24/32–33; H01L 2224/32227

USPC .......................................................... 257/659
See application file for complete search history.

(56) References Cited

U.S. PATENT DOCUMENTS

| 8,258,012 B2 | 9/2012 | Pagaila et al. |
| 10,134,685 B1 | 11/2018 | Chen et al. |
| 2012/0086109 A1* | 4/2012 | Kim .................... H01L 25/0657 257/659 |

FOREIGN PATENT DOCUMENTS

CN         103000539 B     5/2016

* cited by examiner

*Primary Examiner* — Didarul A Mazumder
(74) *Attorney, Agent, or Firm* — FOLEY & LARDNER LLP

(57) ABSTRACT

A semiconductor package structure and a method for manufacturing a semiconductor package structure are provided. The semiconductor package structure includes an electronic component, a conductive contact, and a first shielding layer. The electronic component has a first surface, a lateral surface angled with the first surface, and a second surface opposite to the first surface. The conductive contact is connected to the first surface of the electronic component. The first shielding layer is disposed on the lateral surface of the electronic component and a portion of the first surface of the electronic component. The first shielding layer contacts the conductive contact.

15 Claims, 22 Drawing Sheets

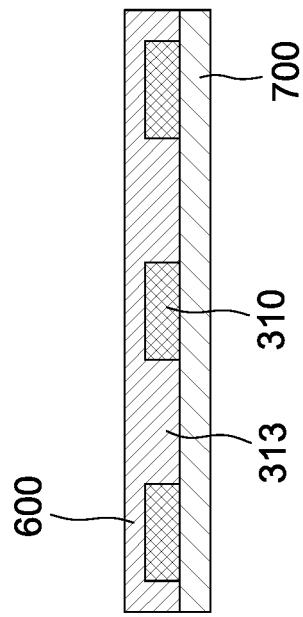
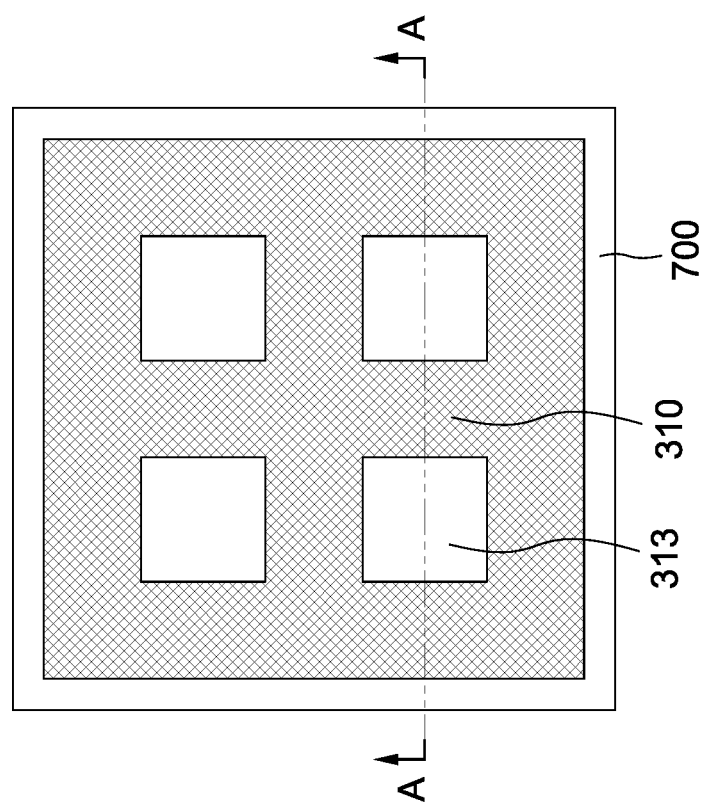
FIG. 3B
FIG. 3A

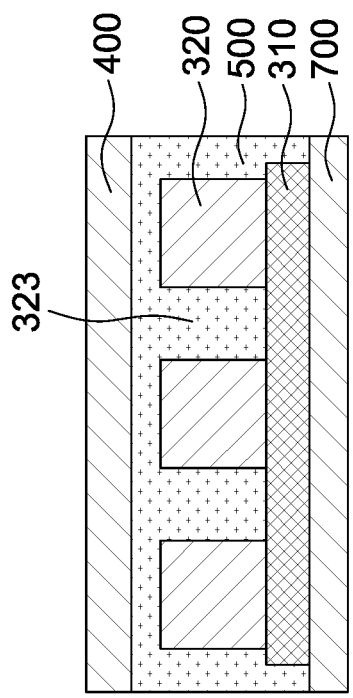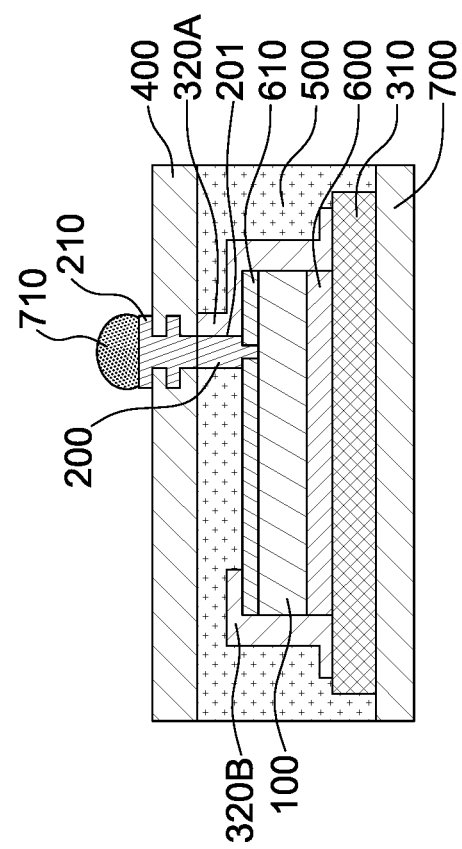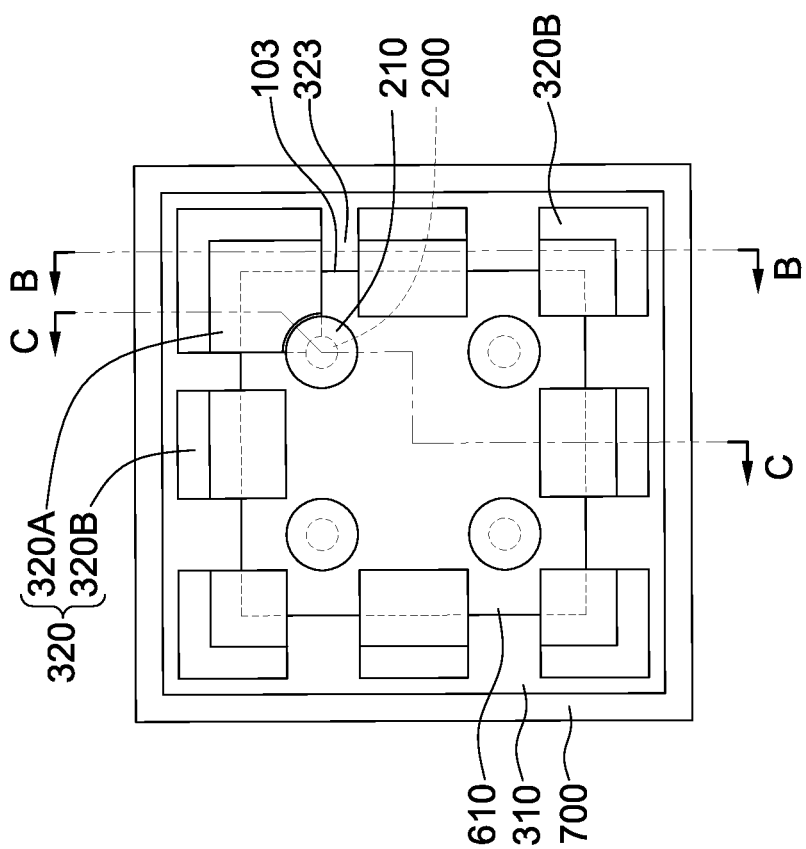

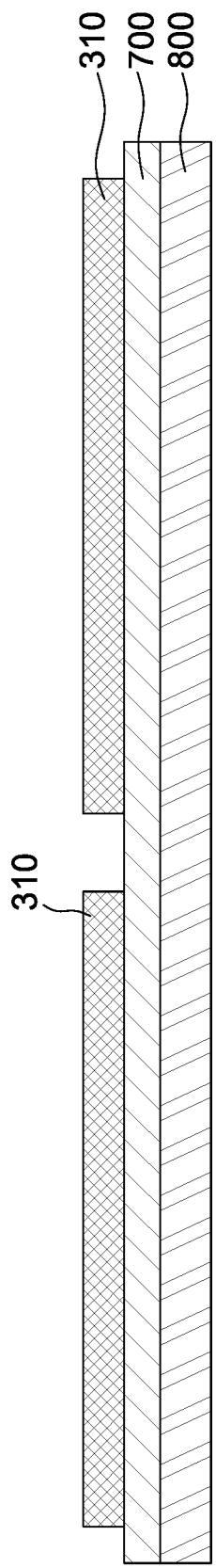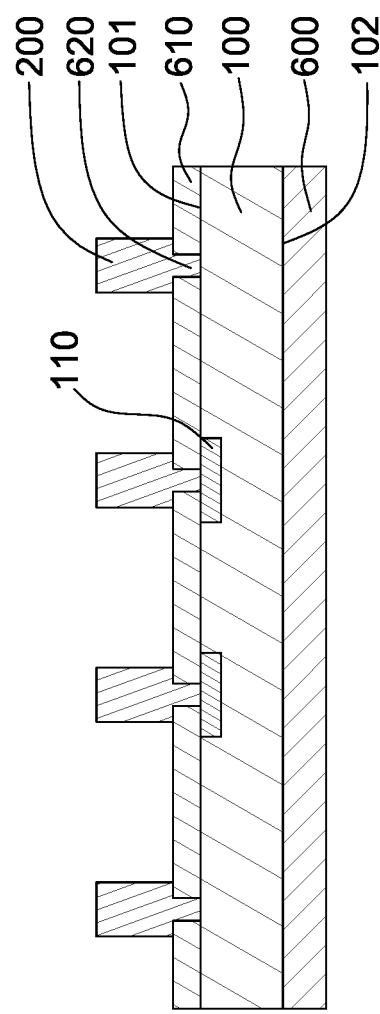

SEMICONDUCTOR PACKAGE STRUCTURE INCLUDING SHIELDING LAYER CONTACTING CONDUCTIVE CONTACT

BACKGROUND

1. Technical Field

The present disclosure relates generally to a semiconductor package structure and a method for manufacturing a semiconductor package structure, particularly to a semiconductor package structure including a shielding layer and a method for manufacturing a semiconductor package structure including a shielding layer.

2. Description of the Related Art

A semiconductor package structure may include a plurality of electronic components. However, interference between adjacent electronic components may adversely affect the performance of the semiconductor package structure. A shielding structure may be needed to provide shielding effectiveness for the adjacent electronic components.

SUMMARY

In one or more embodiments, a semiconductor package structure includes an electronic component, a conductive contact, and a first shielding layer. The electronic component has a first surface, a lateral surface angled with the first surface, and a second surface opposite to the first surface. The conductive contact is connected to the first surface of the electronic component. The first shielding layer is disposed on the lateral surface of the electronic component and a portion of the first surface of the electronic component. The first shielding layer contacts the conductive contact.

In one or more embodiments, a semiconductor package structure includes a plurality of electromagnetic-sensitive devices, a first EMI shielding layer, and a second EMI shielding layer. The first EMI shielding layer encapsulates a first electromagnetic-sensitive device of the plurality of electromagnetic-sensitive devices. The second EMI shielding layer encapsulates a second electromagnetic-sensitive device of the plurality of electromagnetic-sensitive devices.

In one or more embodiments, a method for manufacturing a semiconductor package structure includes the following operations: providing an electronic component including a plurality of conductive elements; and forming a shielding layer to encapsulate the electronic component. A contact area between the shielding layer and a first conductive element of the plurality of conductive elements is greater than a contact area between the shielding layer and a second conductive element of the plurality of conductive elements.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 3A illustrates an enlarged top view of a portion of a semiconductor package structure in accordance with some embodiments of the present disclosure;

FIG. 3B illustrates an enlarged cross-sectional view of a portion of a semiconductor package structure in accordance with some embodiments of the present disclosure;

FIG. 4A illustrates an enlarged top view of a portion of a semiconductor package structure in accordance with some embodiments of the present disclosure;

FIG. 4B illustrates an enlarged cross-sectional view of a portion of a semiconductor package structure in accordance with some embodiments of the present disclosure;

FIG. 4C illustrates an enlarged cross-sectional view of a portion of a semiconductor package structure in accordance with some embodiments of the present disclosure;

FIG. 8A, FIG. 8B, FIG. 8C, FIG. 8D, FIG. 8E, FIG. 8F, FIG. 8G, FIG. 8H and FIG. 8I illustrate various operations in a method of manufacturing a semiconductor package structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
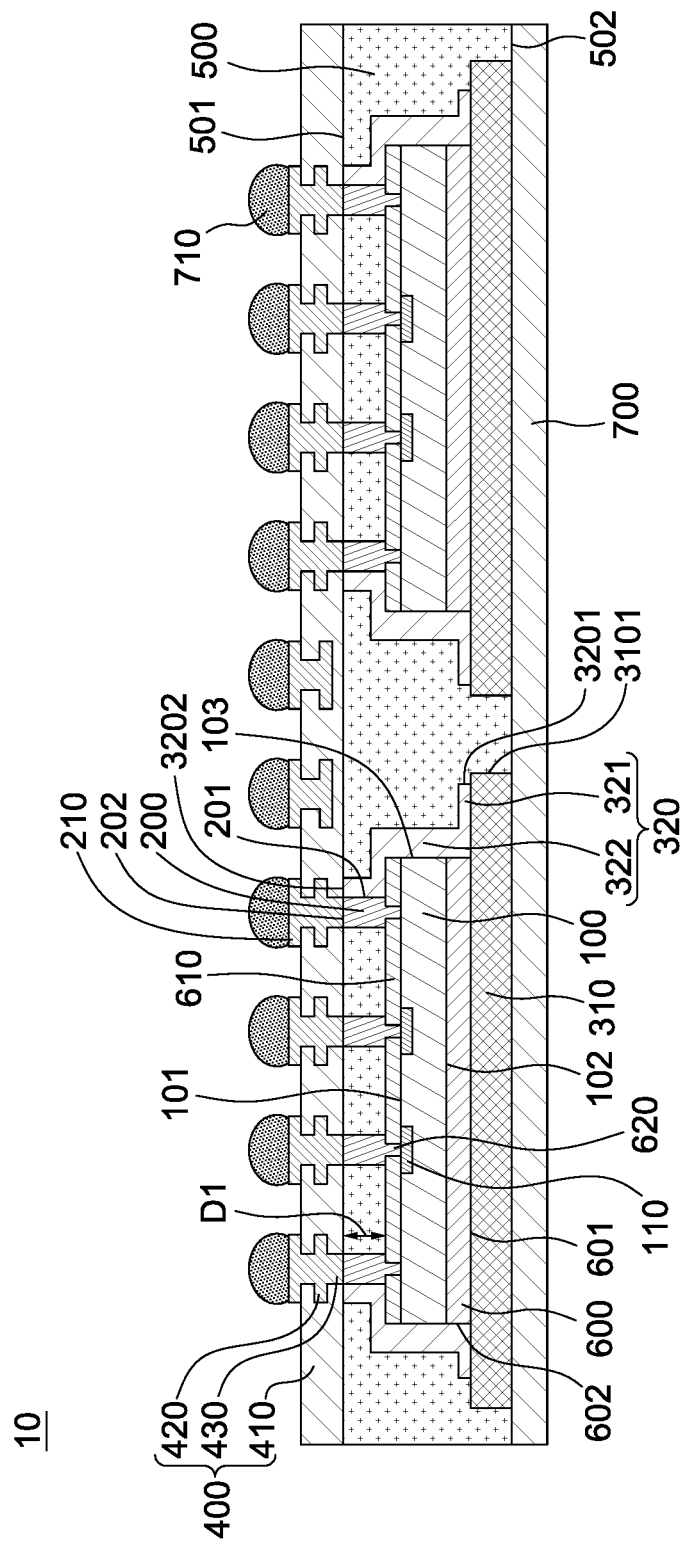
FIG. 1 illustrates a cross-sectional view of a semiconductor package structure in accordance with some embodiments of the present disclosure.

FIG. 1 illustrates a cross-sectional view of a semiconductor package structure 10 in accordance with some embodiments of the present disclosure. The semiconductor package structure 10 includes an electronic component 100, shielding layers 310 and 320, a redistribution layer 400, an encapsulant 500, a conductive pad 210, an adhesive layer 600, an insulating layer 610, a substrate 700, and connecting elements 710.

The electronic component 100 has a surface 101, a lateral surface 103 angled with the surface 101, and a surface 102 opposite to the surface 101. In some embodiments, the surface 101 is the active surface of the electronic component 100, and the surface 102 is the inactive surface of the electronic component 100. The electronic component 100 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. In some embodiments, the electronic component 100 may be or include an electromagnetic-sensitive device, for example, a body acoustic wave (BAW) filter. In some embodiments, the semiconductor package structure 10 may include a plurality of electronic components 100.

The conductive contact 200 (also referred to "the conductive element") is connected to the surface 101 of the electronic component 100. In some embodiments, the semiconductor package structure 10 includes a plurality of conductive contacts 200. In some embodiments, the conductive contacts 200 include one or more signal I/O terminals and a grounding terminal. In some embodiments, the conductive contact 200 may be or include a conductive pillar. In some embodiments, the conductive contact 200 may be or include a non-solder structure. In some embodiments, the conductive contact 200 has a thickness D1 that is greater than about 5 μm. The conductive contact 200 may include a conductive material such as a metal or metal alloy. Examples include gold (Au), silver (Ag), aluminum (Al), copper (Cu), or an alloy thereof.

The shielding layer 310 (also referred to as "a bottom shielding layer") is on the surface 102 of the electronic component 100. In some embodiments, an edge (e.g., an edge 3101) of the shielding layer 310 is protruded from the lateral surface 103 of the electronic device 100. In some embodiments, the shielding layer 310 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof.

The shielding layer 320 is disposed on the lateral surface 103 of the electronic component 100 and a portion of the surface 101 of the electronic component 100. In some embodiments, the shielding layer 320 is conformal with the lateral surface 103 of the electronic component 100 and a portion of the surface 101 of the electronic component 100. In some embodiments, the shielding layer 320 covers the lateral surface 103 of the electronic component 100. In some embodiments, the shielding layer 320 directly contacts or physically contacts the lateral surface 103 of the electronic component 100. In some embodiments, the shielding layer 320 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. In some embodiments, the shielding layer 320 contacts the shielding layer 310. In some embodiments, the shielding layer 320 directly contacts or physically contacts the shielding layer 310. In some embodiments, the shielding layer 310 and the shielding layer 320 may form a shielding composite layer. In some embodiments, the shielding layer 310 and the shielding layer 320 may form an EMI shielding layer. In some embodiments, the semiconductor package structure 10 may include a plurality of EMI shielding layers, and each of the EMI shielding layers may include the shielding layers 310 and 320. In some embodiments, the semiconductor package structure 10 may include two or more EMI shielding layers each encapsulating one of the electronic components 100.

In some embodiments, the shielding layer 320 contacts the conductive contact 200. In some embodiments, the shielding layer 320 directly contacts or physically contacts the conductive contact 200. In some embodiments, the shielding layer 320 directly contacts or physically contacts the conductive contact 200 that serves as a grounding terminal. In some embodiments, the conductive contact 200 includes a conductive pillar, and the shielding layer 320 is on a lateral surface (e.g., a lateral surface 201) of the conductive pillar. In some embodiments, the shielding layer 320 is conformal with the lateral surface 201 of the conductive contact 200, the lateral surface 103 of the electronic component 100, and a portion of the surface 101 of the electronic component 100.

In some cases where a compartment shielding layer is formed to connect to a portion of a grounding layer exposed from the lateral side of the electronic component, since the grounding layer is formed of a portion of a relatively thin RDL (e.g., from about 3 μm to about 5 μm) within the electronic component, the portion of the relatively thin grounding layer exposed from the lateral side of the electronic component may easily peel off after subjected to a singulation or sawing operation performed thereon, resulting in failure of contact between the grounding layer and the compartment shielding layer. In contrast, according to some embodiments of the present disclosure, with the aforesaid design of the shielding layers 310 and 320, a chip scale shielding layer may be formed on individual electronic components 100 to connect to a grounding terminal (e.g., the conductive contact 200) of the electronic component 100, thus the aforesaid contact issue can be effectively prevented, and therefore the reliability and the electrical performance of the semiconductor package structure 10 can be enhanced.

Moreover, in some cases where a compartment shielding layer is formed by forming trenches in an encapsulant between electronic components, filling the trenches with a shielding material, and performing a singulation operation by cutting through the shielding material in the trenches to separate the electronic components, the compartment shielding layer is formed from the cut shielding material and is over each of the electronic components. The trenches may fail to expose a portion of a grounding layer of the electronic components due to the displacement of a photomask (mask or reticle) with respect to the electronic components in the singulation operation, a relatively large space (i.e., design rule) is required to provide processing tolerance for the cutting operation which can result in an increased size of the package structure, the depths of the trenches require delicate control over various parameters in the process, and the profile of the as-formed compartment shielding layer may also be adversely affected in the singulation operation due to the misalignment of the cutting line with respect to the trenches.

In contrast, according to some embodiments of the present disclosure, with the aforesaid design of the shielding layer 320, a chip scale shielding layer may be formed on lateral surfaces of individual electronic components 100 without being subjected to an alignment operation and/or a cutting operation, thus the aforesaid profile issue of the shielding layer 320 can be effectively avoided, and therefore the electrical performance of the shielding layer 320 can be improved. Furthermore, since an extra space saved for the processing tolerance for the cutting operation can be omitted, the size of the semiconductor package structure 10 can be reduced.

In addition, according to some embodiments of the present disclosure, with the aforesaid design of the conductive contact 200 and the shielding layer 320, a greater contact area can be provided between the conductive contact 200 (e.g., the grounding terminal) and the shielding layer 320, resulting in a reliable electrical connection between the shielding layer 320 and the conductive contact 200, and therefore the reliability and the electrical performance of the semiconductor package structure 10 can be further enhanced. Furthermore, according to some embodiments of the present disclosure, the shielding layer 320 extends to be connected to the conductive contact 200 instead of extending all the way to reach an exposed portion of a grounding trace of the redistribution layer 400, the extending length (also referred to as "the sputtering depth" when the shielding layer 320 is formed by sputtering) of the shielding layer 320 along a direction perpendicular to the surface 101 of the electronic component 100 is relatively short, thus the thickness of the shielding layer 320 can be more uniform, and therefore the electrical performance of the shielding layer 320 can be relatively satisfactory.

Moreover, according to some embodiments of the present disclosure, since the shielding layers 310 and 320 can be formed as a chip scale shielding layer, other electronic components and/or devices that cannot be shielded and/or are free of shielding layers can be formed in the same semiconductor package structure (e.g., on the same substrate 700 with the electronic components 100), and therefore the flexibility of the arrangements of electronic components and/or devices in the semiconductor package structure 10 can be significantly increased, and the manufacturing process of forming the semiconductor package structure 10 including various electronic components and/or devices can be relatively simplified.

In some embodiments, the shielding layer 320 includes portions 321 and 322. In some embodiments, the portion 322 of the shielding layer 320 is angled with the portion 321 of the shielding layer 320. In some embodiments, the portion 321 of the shielding layer 320 is substantially perpendicular to the portion 322 of the shielding layer 320. In some embodiments, the portion 321 of the shielding layer 320 extends away from the electronic component 100. In some embodiments, the portion 321 of the shielding layer 320 is connected to the shielding layer 310. In some embodiments, an edge 3101 of the shielding layer 310 and an edge 3201 of the portion 321 of the shielding layer 320 are discontinuous. In some embodiments, the edge 3201 of the portion 321 of the shielding layer 320 is recessed from the edge 3101 of the shielding layer 310. In some embodiments, the shielding layer 310 is protruded from the edge 3201 of the portion 321 of the shielding layer 320. In some embodiments, the portion 322 of the shielding layer 320 contacts the conductive contact 200. In some embodiments, the portion 322 of the shielding layer 320 directly contacts or physically contacts the conductive contact 200.

The redistribution layer 400 is on the conductive contact 200 and the shielding layer 320. In some embodiments, the redistribution layer 400 includes a dielectric layer 410, a plurality of traces 420, and a plurality of through vias 430.

In some embodiments, the redistribution layer 400 contacts the shielding layer 320. In some embodiments, the redistribution layer 400 directly contacts or physically contacts the shielding layer 320. In some embodiments, the conductive contact 200 includes a conductive pillar, and the redistribution layer 400 contacts the conductive pillar. In some embodiments, the redistribution layer 400 directly contacts or physically contacts the conductive pillar. In some embodiments, the conductive contact 200 includes a conductive pillar, and the shielding layer 320 contacts the lateral surface (e.g., the lateral surface 201) of the conductive pillar. In some embodiments, the shielding layer 320 directly contacts or physically contacts the lateral surface (e.g., the lateral surface 201) of the conductive pillar. In some embodiments, a surface 202 of the conductive contact 200 and a surface 3202 of the shielding layer 320 are substantially coplanar.

The encapsulant 500 encapsulates the electronic component 100, the conductive contact 200, and the shielding layers 310 and 320. In some embodiments, the conductive contact 200 includes a conductive pillar, and the encapsulant 500 encapsulates the electronic component 100, the conductive pillar, and the shielding layers 310 and 320. In some embodiments, the surface 3202 of the shielding layer 320 is exposed from the encapsulant 500 and contacting the redistribution layer 400. In some embodiments, a surface 501 (also referred to as "an upper surface") of the encapsulant 500 and the surface 202 of the conductive contact 200 are substantially coplanar. In some embodiments, the surface 501 of the encapsulant 500, the surface 202 of the conductive contact 200, and the surface 3202 of the shielding layer 320 are substantially coplanar. In some embodiments, the redistribution layer 400 is on the surface 501 of the encapsulant 500. The encapsulant 500 may include an epoxy resin having fillers, a molding compound (e.g., an epoxy molding compound or other molding compound), a polyimide, a phenolic compound or material, a material with a silicone dispersed therein, or a combination thereof.

The conductive pad 210 is disposed on the redistribution layer 400 and connected to the conductive contact 200. In some embodiments, a portion of the shielding layer 320 overlaps a projection of the conductive pad 210. In some embodiments, a portion of the shielding layer 320 is directly under the conductive pad 210. The conductive pad 210 may include a conductive material such as a metal or metal alloy. Examples include gold (Au), silver (Ag), aluminum (Al), copper (Cu), or an alloy thereof.

The adhesive layer 600 is between the shielding layer 310 and the surface 102 of the electronic component 100. In some embodiments, the adhesive layer 600 contacts the shielding layer 310 and the electronic component 100 so as to connect the shielding layer 310 to the surface 102 of the electronic component 100. In some embodiments, the adhesive layer 600 contacts the shielding layer 320. In some embodiments, the adhesive layer 600 includes a surface 601 also referred to as "a bottom surface") and a surface 602 (also referred to as "a lateral surface") angled with the surface 601. In some embodiments, the shielding layer 310 contacts the surface 602 of the adhesive layer 600, and the shielding layer 320 contacts the surface 602 of the adhesive layer 600.

The insulating layer 610 is disposed on the surface 101 of the electronic component 100. In some embodiments, the insulating layer 610 defines one or more openings 620 to expose one or more conductive pads 110 of the electronic components 100. In some embodiments, a portion of the conductive contact 200 extends into the opening 620 of the insulating layer 610 to connect to the conductive pad 120 of the electronic component 100. In some embodiments, the insulating layer 610 may be formed of or include an organic insulating material, such as polyamide (PA) or polyimide (PI).

The substrate 700 is disposed on the shielding layer 310. The substrate 700 include, for example, a printed circuit board, such as a paper-based copper foil laminate, a composite copper foil laminate, or a polymer-impregnated glass-fiber-based copper foil laminate. In some embodiments, the substrate 700 may include an organic substrate, such as a polyimide (PI) substrate. In some embodiments, the substrate 700 may serve as a protection layer for supporting the electronic components 100 during the singulation operation in the manufacturing process for the semiconductor package structure. In some embodiments, the substrate 700 may include a marking on the surface(s) thereof. In some embodiments, the CTE of the substrate 700 may be adjusted to substantially match the CTE of the redistribution layer 400 (which will be discussed hereinafter) so as to reduce the warpage of the semiconductor package structure 10.

The connecting elements 710 are disposed on the conductive pads 210. In some embodiments, the connecting elements 710 may be or may include gold (Au), silver (Ag), copper (Cu), another metal, a solder alloy, or a combination of two or more thereof. In some embodiments, the connecting elements 710 may be or include solder bumps, solder balls, solder pastes, or a combination thereof. The solder balls may include a controlled collapse chip connection (C4) bump, a ball grid array (BGA) or a land grid array (LGA).

Figure 1A:
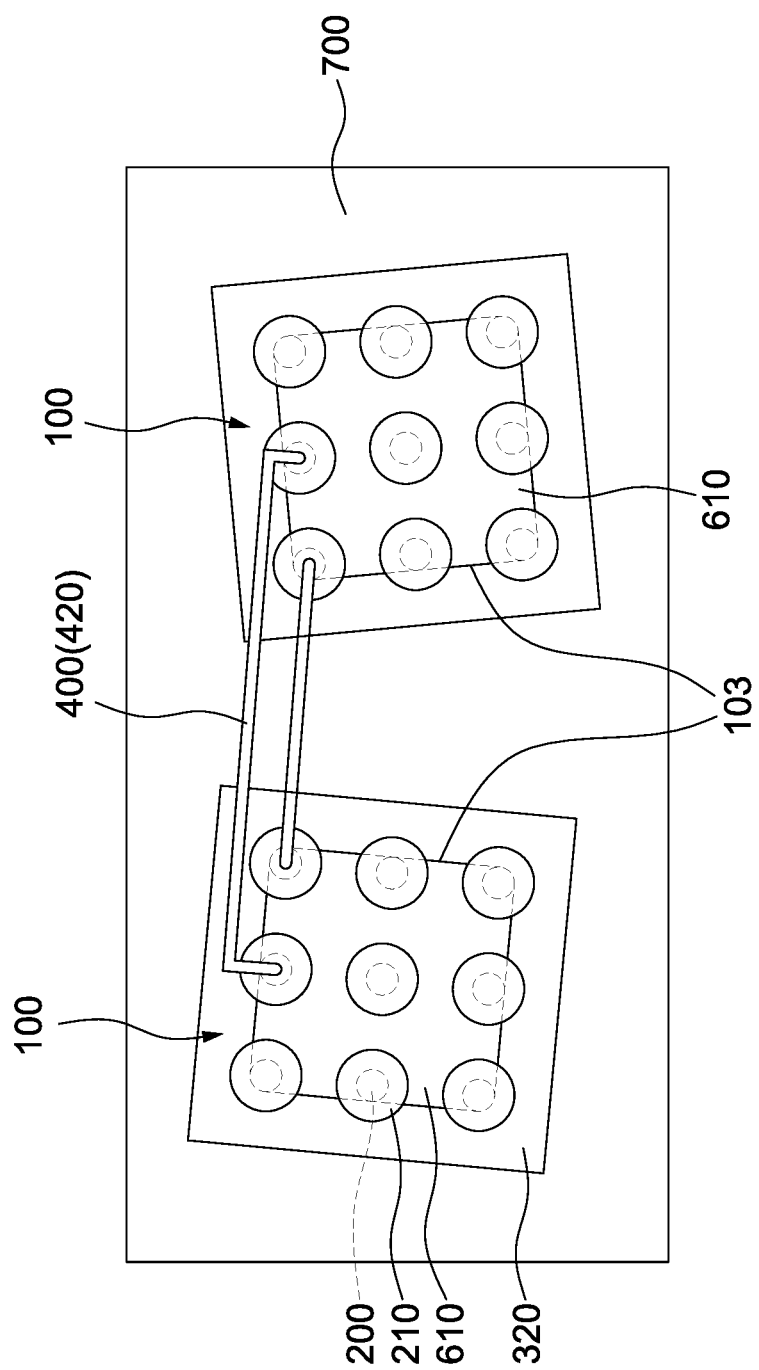
FIG. 1A illustrates a top view of a semiconductor package structure in accordance with some embodiments of the present disclosure.

FIG. 1A illustrates a top view of a semiconductor package structure 10 in accordance with some embodiments of the present disclosure. It should be noted that some components are omitted for clarity. In some embodiments, FIG. 1A shows a top view of the arrangement of the redistribution layer 400 and the electronic components 100.

In some embodiments, the semiconductor package structure 10 includes two or more electronic components 100 on the substrate 700. In some embodiments, the electronic components 100 may be or include electromagnetic-sensitive devices. In some embodiments, a lateral surface 103 of one of the electronic components 100 is adjacent to a lateral surface 103 of another one of the electronic components 100, and the two lateral surfaces 103 are non-parallel. For example, the two lateral surfaces 103 of the two electronic components 100 may extend along non-parallel directions. In some embodiments, the aforesaid non-parallel arrangement of the adjacent electronic components 100 may result from the shift or rotation in positions of the electronic components 100 when bonding to the substrate 700. In some embodiments, the redistribution layer 400 is disposed on the encapsulant 500 (not shown in FIG. 1A) and crossing two electronic components 100 to electrically connect the two electronic components 100. In some embodiments, the trace 420 of the redistribution layer 400 electrically connects the two conductive pads 210 on the two electronic components 100. According to some embodiments of the present disclosure, despite that the lateral surfaces 103 of adjacent electronic components 100 are non-parallel, the redistribution layer 400 is formed over the encapsulant 500 and can cross the electronic components 100 to form the electrical interconnection between the electronic components 100.

Figure 2C:
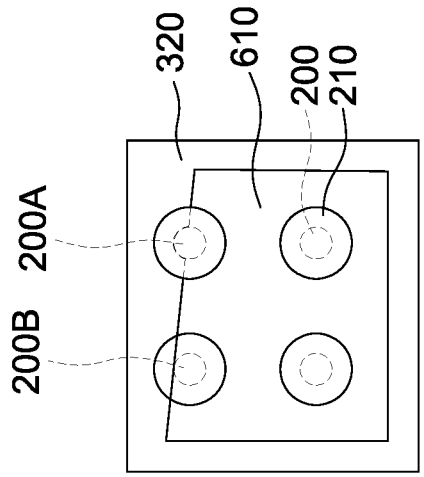
FIG. 2C illustrates an enlarged top view of a portion of a semiconductor package structure in accordance with some embodiments of the present disclosure.
Figure 2B:
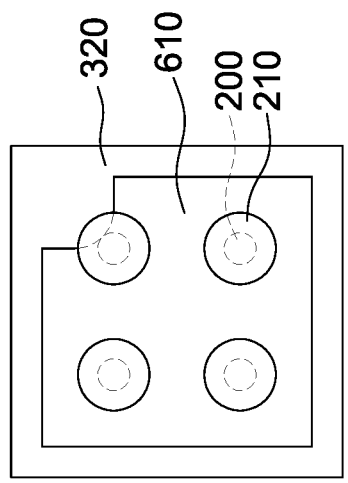
FIG. 2B illustrates an enlarged top view of a portion of a semiconductor package structure in accordance with some embodiments of the present disclosure.
Figure 2A:
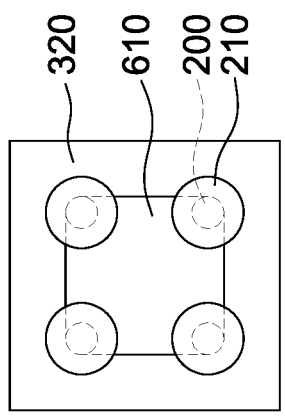
FIG. 2A illustrates an enlarged top view of a portion of a semiconductor package structure in accordance with some embodiments of the present disclosure.

FIG. 2A illustrates an enlarged top view of a portion of a semiconductor package structure 10 in accordance with some embodiments of the present disclosure. It should be noted that some components are omitted for clarity. In some embodiments, FIG. 2A shows a top view of the arrangement of the shielding layer 320, the insulating layer 610, the conductive contacts 200, and the conductive pads 210.

In some embodiments, the shielding layer 320 contacts a plurality of the conductive contacts 200. In some embodiments, a portion of the shielding layer 320 overlaps with the conductive pads 210 from a top view perspective.

FIG. 2B illustrates an enlarged top view of a portion of a semiconductor package structure 10 in accordance with some embodiments of the present disclosure. It should be noted that some components are omitted for clarity. In some embodiments, FIG. 2B shows a top view of the arrangement of the shielding layer 320, the insulating layer 610, the conductive contacts 200, and the conductive pads 210.

In some embodiments, the shielding layer 320 contacts one of the conductive contacts 200, and the shielding layer 320 is spaced apart from the other conductive contacts 200. In some embodiments, the conductive contact 200 that contacts the shielding layer 320 may serve as a grounding terminal, and the other conductive contacts 200 spaced apart from the shielding layer 320 may serve as or connections to signal I/O terminals.

In the cases where a compartment shielding layer is connected to a grounding terminal of an electronic component, an exposed portion of a trace in the electronic component serves as a grounding terminal, and thus the grounding terminal is required to be positioned at an edge of the electronic component. In contrast, according to some embodiments of the present disclosure, the shielding layer 320 can extend towards the conductive contact 200 which serves as a grounding terminal, thus the arrangement of the grounding terminal of the electronic component 100 can vary and not limited to be positioned at an edge of the electronic component, and trace(s) merely serving as a grounding terminal in the electronic component 100 can be omitted. Therefore the flexibility of the arrangement of the grounding and I/O terminals can be increased, and the size of the semiconductor package structure can be reduced.

FIG. 2C illustrates an enlarged top view of a portion of a semiconductor package structure in accordance with some embodiments of the present disclosure. It should be noted that some components are omitted for clarity. In some embodiments, FIG. 2C shows a top view of the arrangement of the shielding layer 320 and the conductive contacts 200, 200A and 200B.

In some embodiments, the conductive contact 200A and the conductive contact 200B contact the shielding layer 320. In some embodiments, the conductive contacts 200A and 200B may serve as grounding terminals. In some embodiments, the conductive contact 200 is spaced apart from the shielding layer 320. In some embodiments, the conductive contact 200 may serve as a signal I/O terminal. In some embodiments, a contact area between the shielding layer 320 and the conductive contact 200A is greater than a contact area between the shielding layer 320 and the conductive contact 200B. In some embodiments, the contact area between the shielding layer 320 and the conductive contact 200B is greater than a contact area between the shielding layer 320 and the conductive contact 200.

FIG. 3A illustrates an enlarged top view of a portion of a semiconductor package structure 10 in accordance with some embodiments of the present disclosure. It should be noted that some components are omitted for clarity. In some embodiments, FIG. 3A shows a top view of the arrangement of the shielding layer 310 and the substrate 700.

In some embodiments, the shielding layer 310 includes an opening 313. In some embodiments, the shielding layer 310 includes a plurality of the openings 313. In some embodiments, portions of the substrate 700 are exposed from the opening(s) 313. In some embodiments, the one or more openings 313 are directly above the substrate 700.

FIG. 3B illustrates an enlarged cross-sectional view of a portion of a semiconductor package structure 10 in accordance with some embodiments of the present disclosure. It should be noted that some components are omitted for clarity. In some embodiments, FIG. 3B may illustrate a cross-sectional view of the arrangement of the shielding layer 310, the adhesive layer 600, and the substrate 700.

In some embodiments, a portion of the adhesive layer 600 is disposed in the opening(s) 313 of the shielding layer 310. In some embodiments, a portion of the adhesive layer 600 is filled in the opening(s) 313 of the shielding layer 310. In some embodiments, a portion of the adhesive layer 600 extends into the opening(s) 313 and contacts the substrate 700. In some embodiments, a portion of the adhesive layer 600 passes through the opening(s) 313 to directly contact or physically contact the substrate 700. According to some embodiments of the present disclosure, with the aforesaid design of the shielding layer 310, the increased contact area between the adhesive layer 600 and the shielding layer 310 can increased the adhesion between the adhesive layer 600 and the shielding layer 310, and thus the reliability of the semiconductor package structure can be increased.

FIG. 4A illustrates an enlarged top view of a portion of a semiconductor package structure 10 in accordance with some embodiments of the present disclosure. It should be noted that some components are omitted for clarity. In some embodiments, FIG. 4A shows a top view of the arrangement of the shielding layer 310, the shielding layer 310, conductive contact 200, the conductive pad 310, and the insulating layer 610.

In some embodiments, the shielding layer 320 includes a plurality of segments 320A and 320B. In some embodiments, the segments 320A and 320B cover portions of the insulating layer 610. In some embodiments, a portion of the segment 320A overlaps with the conductive pad 210 from a top view perspective. In some embodiments, the segment 320A contacts the conductive contact 200. In some embodiments, the segments 320B are spaced apart from the conductive contacts 200. In some embodiments, the shielding layer 320 partially covers the lateral surface 103 of the electronic component 100. In some embodiments, the shielding layer 320 includes an opening 323 exposing a portion of the lateral surface 103 of the electronic component 100. In some embodiments, the shielding layer 320 includes a plurality of the openings 323 exposing portions of the lateral surface 103 of the electronic component 100 In some embodiments, two adjacent segments 320A/320B of the shielding layer 320 define one of the openings 323. The shapes, sizes, and/or arrangements of the segments 320A/320B of the shielding layer 320 may vary according to actual needs and are not limited to the aforementioned.

According to some embodiments of the present disclosure, with the aforesaid design of the segments 320A/320B of the shielding layer 320, a heterogeneous bonding region between the shielding layer 320 and the electronic component 100 is divided into separate heterogeneous bonding regions each having a relatively small area, thus the stress resulted from a relatively large area of the interface between heterogeneous materials can be reduced and dispersed, and therefore delamination of the shielding layer 320 can be effectively prevented.

FIG. 4B illustrates an enlarged cross-sectional view of a portion of a semiconductor package structure in accordance with some embodiments of the present disclosure. It should be noted that some components are omitted for clarity. In some embodiments, FIG. 4B may illustrate a cross-sectional view along the cross-sectional line B-B' in FIG. 4A.

In some embodiments, a portion of the encapsulant 500 is filled in the opening(s) 323 of the shielding layer 320. In some embodiments, the segments 320A/320B of the shielding layer 320 are spaced apart from each other by the encapsulant 500. In some embodiments, the segments 320A/320B of the shielding layer 320 are electrically connected to the shielding layer 310.

FIG. 4C illustrates an enlarged cross-sectional view of a portion of a semiconductor package structure 10 in accordance with some embodiments of the present disclosure. It should be noted that some components are omitted for clarity. In some embodiments, FIG. 4C may illustrate a cross-sectional view along the cross-sectional line C-C' in FIG. 4A.

In some embodiments, the segment 320A of the shielding layer 320 extends along the lateral surface 201 of the conductive contact 200 to contact the redistribution layer 400. In some embodiments, the segment 320B of the shielding layer 320 is spaced apart from the conductive contacts 200.

Figure 5:
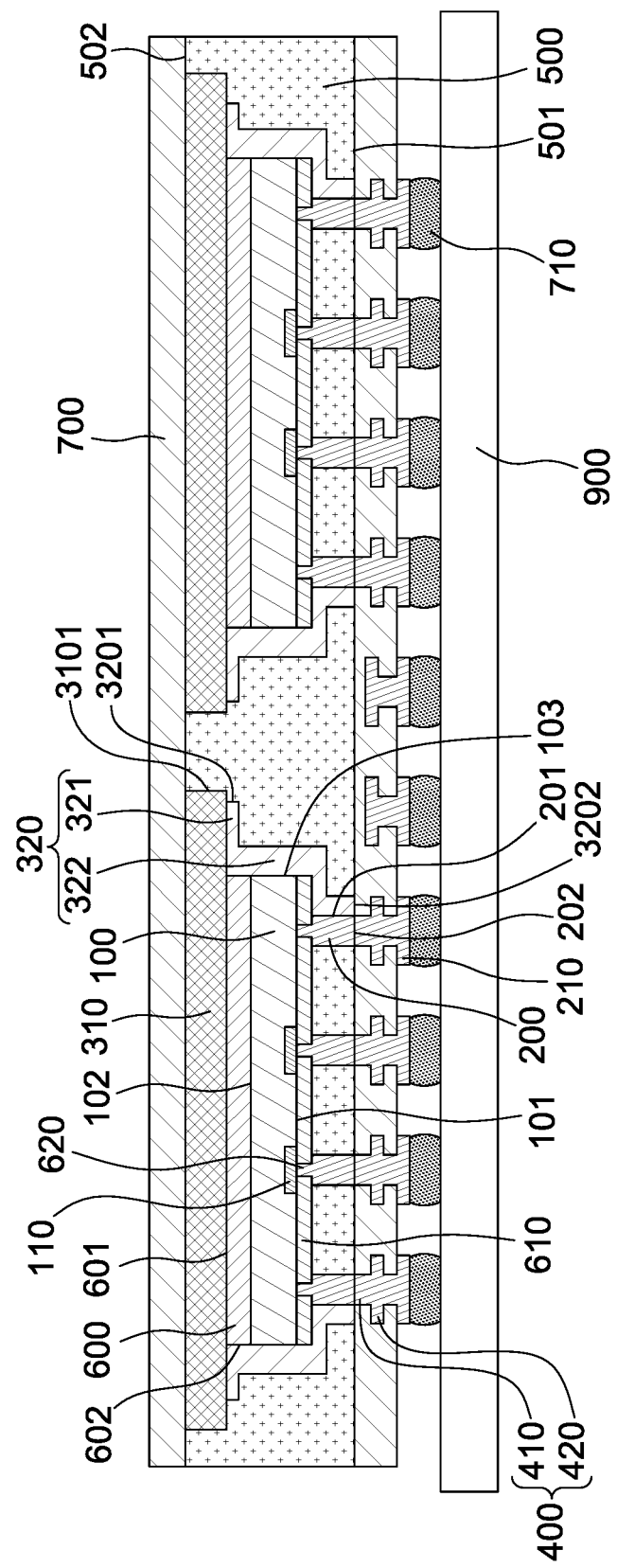
FIG. 5 illustrates a perspective view of a semiconductor package structure in accordance with some embodiments of the present disclosure.

FIG. 5 illustrates a perspective view of a semiconductor package structure 10' in accordance with some embodiments of the present disclosure. The semiconductor package structure 10' is similar to the semiconductor package structure 10 in FIG. 1 except that, for example, the semiconductor package structure 10' further includes a substrate 900.

In some embodiments, the connecting elements 710 are bonded to the substrate 900. In some embodiments, the structure shown in FIG. 1 may be flipped and bonded to the substrate 900 through the connecting elements 710 so as to form the semiconductor package structure 10' shown in FIG. 5.

Figure 6:
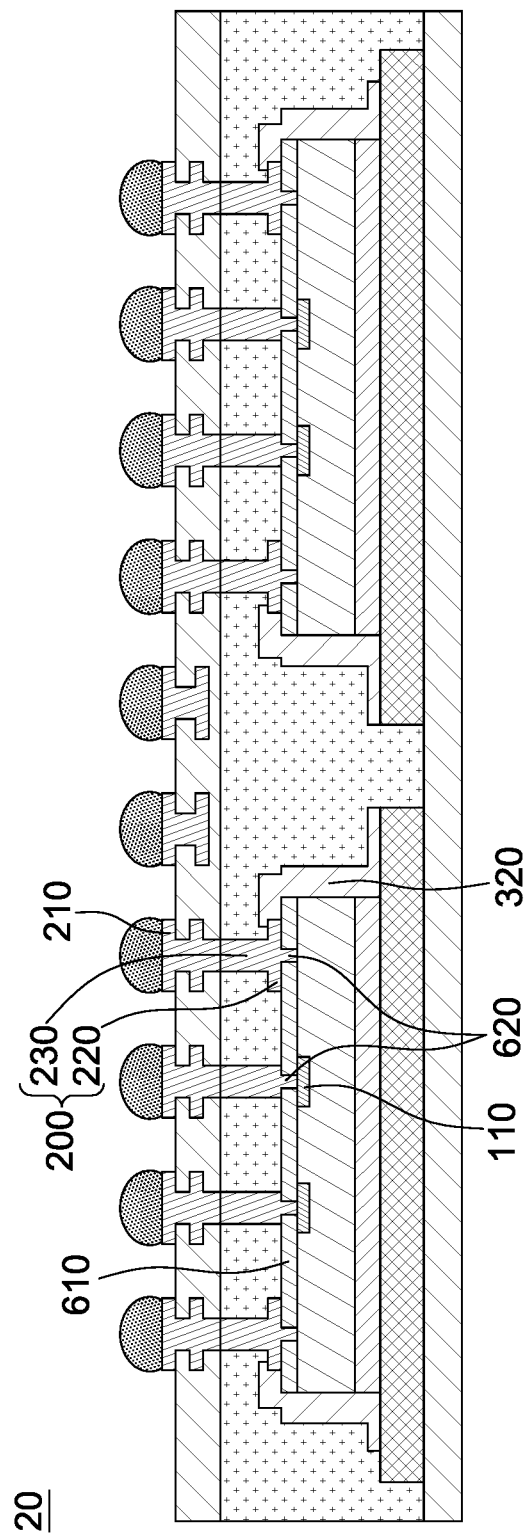
FIG. 6 illustrates a perspective view of a semiconductor package structure in accordance with some embodiments of the present disclosure.

FIG. 6 illustrates a perspective view of a semiconductor package structure 20 in accordance with some embodiments of the present disclosure. The semiconductor package structure 20 is similar to the semiconductor package structure 10 in FIG. 1 except that, for example, the conductive contact 200 and the shielding layer 320 have different structures.

In some embodiments, the conductive contact 200 includes a conductive pillar 230 and a conductive pad 220 connected to the conductive pillar 230. In some embodiments, the conductive pad 220 connects the conductive pillar 230 to the surface 101 of the electronic component 100. In some embodiments, the conductive pad 220 is disposed on the insulating layer 610 and passes through the opening 620 to connect to the surface 101 of the electronic component 100.

In some embodiments, the shielding layer 320 contacts the conductive pad 220. In some embodiments, the shielding layer 320 directly contacts or physically contacts the conductive pad 220. In some embodiments, the conductive pillar 230 is spaced apart from the shielding layer 320 by the conductive pad 220.

Figure 7A:
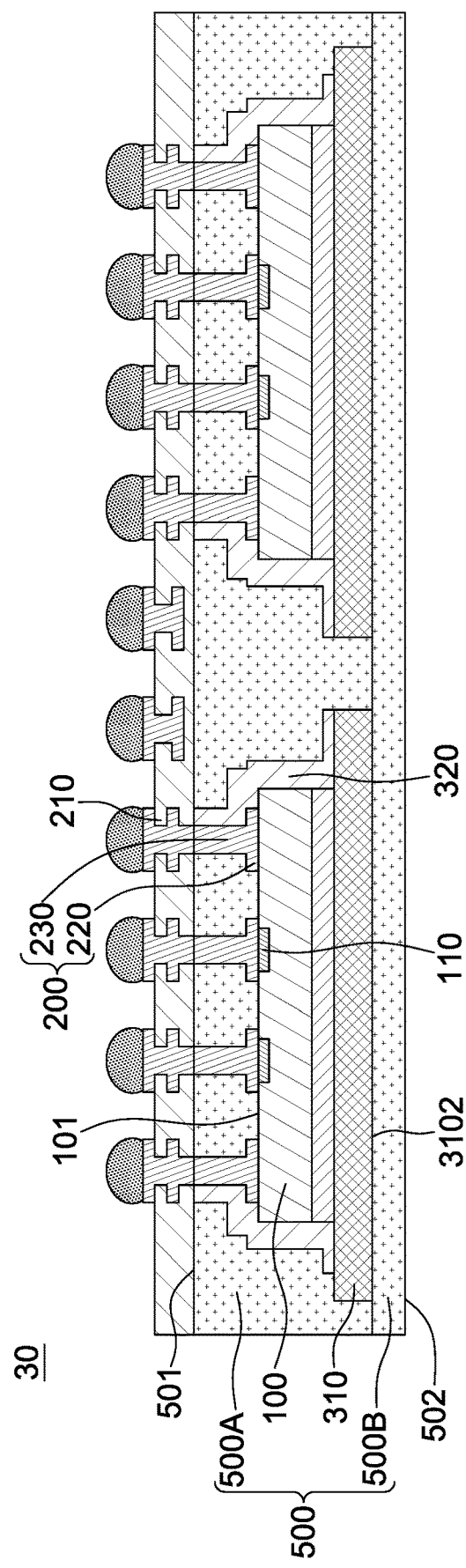
FIG. 7A illustrates a perspective view of a semiconductor package structure in accordance with some embodiments of the present disclosure.

FIG. 7A illustrates a perspective view of a semiconductor package structure 30 in accordance with some embodiments of the present disclosure. The semiconductor package structure 30 is similar to the semiconductor package structure 10 in FIG. 1 except that, for example, the semiconductor package structure 30 does not include a substrate on the shielding layer 310.

In some embodiments, a surface 3102 (also referred to as "a bottom surface") of the shielding layer 310 facing away from the electronic component 100 is covered by the encapsulant 500. In some embodiments, the encapsulant 500 may include portions 500A and 500B. In some embodiments, the portions 500A and 500B may include the same or different materials. In some embodiments, the encapsulant 500 has a surface 502 opposite to the surface 501, and the surface 502 of the encapsulant 500 is at an elevation different from that of the surface 3102 of the shielding layer 310. In some embodiments, the conductive pad 210 is disposed on the surface 101 of the electronic component 100. In some embodiments, the conductive pad 210 contacts the surface 101 and the conductive pad 110 of the electronic component 100.

Figure 7B:
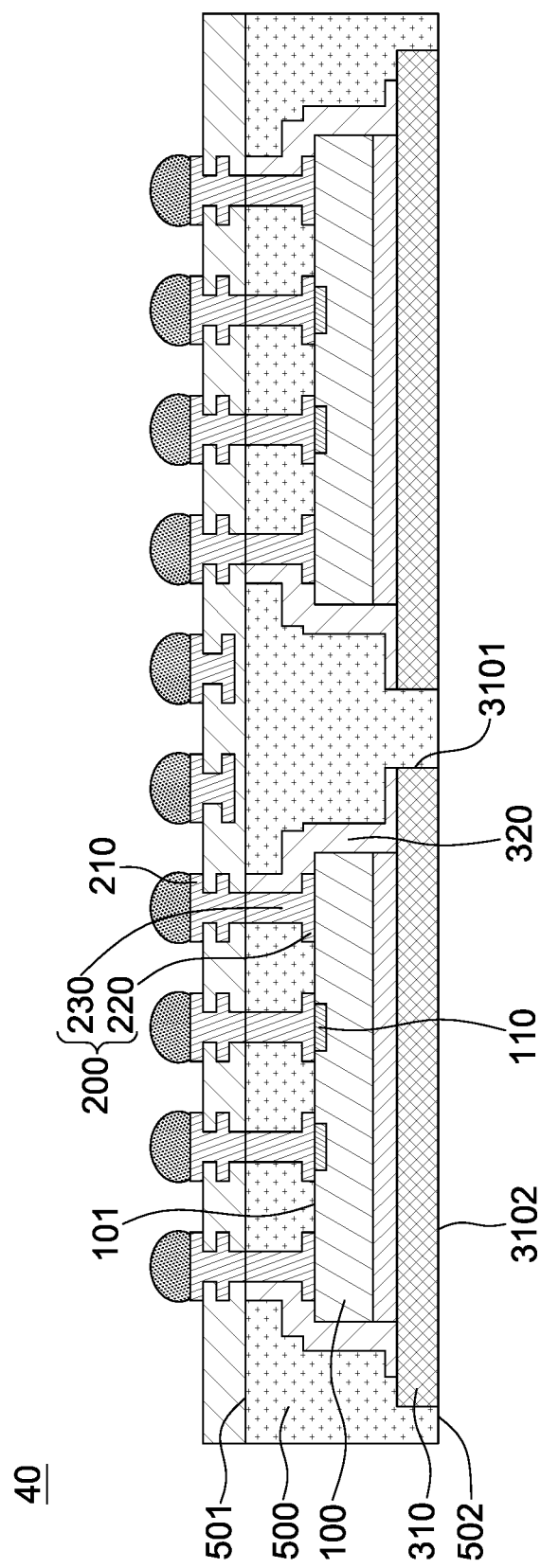
FIG. 7B illustrates a perspective view of a semiconductor package structure in accordance with some embodiments of the present disclosure.

FIG. 7B illustrates a perspective view of a semiconductor package structure 40 in accordance with some embodiments of the present disclosure. The semiconductor package structure 40 is similar to the semiconductor package structure 30 in FIG. 7A except that, for example, the encapsulant 500 has a different structure.

In some embodiments, the surface 3102 (also referred to as "the bottom surface") of the shielding layer 310 facing away from the electronic component 100 is exposed from the encapsulant 500. In some embodiments, the surface 3102 of the shielding layer 310 is substantially coplanar with the surface 502 of the encapsulant 500.

FIG. 8A, FIG. 8B, FIG. 8C, FIG. 8D, FIG. 8E, FIG. 8F, FIG. 8G, FIG. 8H and FIG. 8I illustrate various operations in a method of manufacturing a semiconductor package structure 10 in accordance with some embodiments of the present disclosure.

Referring to FIG. 8A, a plurality of shielding layers 310 are formed on a carrier 800. The shielding layer 320 may be formed by sputtering or plating.

Referring to FIG. 8B, one or more electronic components 100 (or dies) are provided. In some embodiments, the electronic component 100 includes a plurality of conductive contacts 200. In some embodiments, an adhesive layer 600 is formed on a surface 102 of the electronic component 100, an insulating layer 610 is formed on a surface 101 of the electronic component 100, and the conductive contact 200 is formed to connect to a conductive pad 110 of the electronic component 100 through an opening 620 of the insulating layer 610.

Figure 8C:
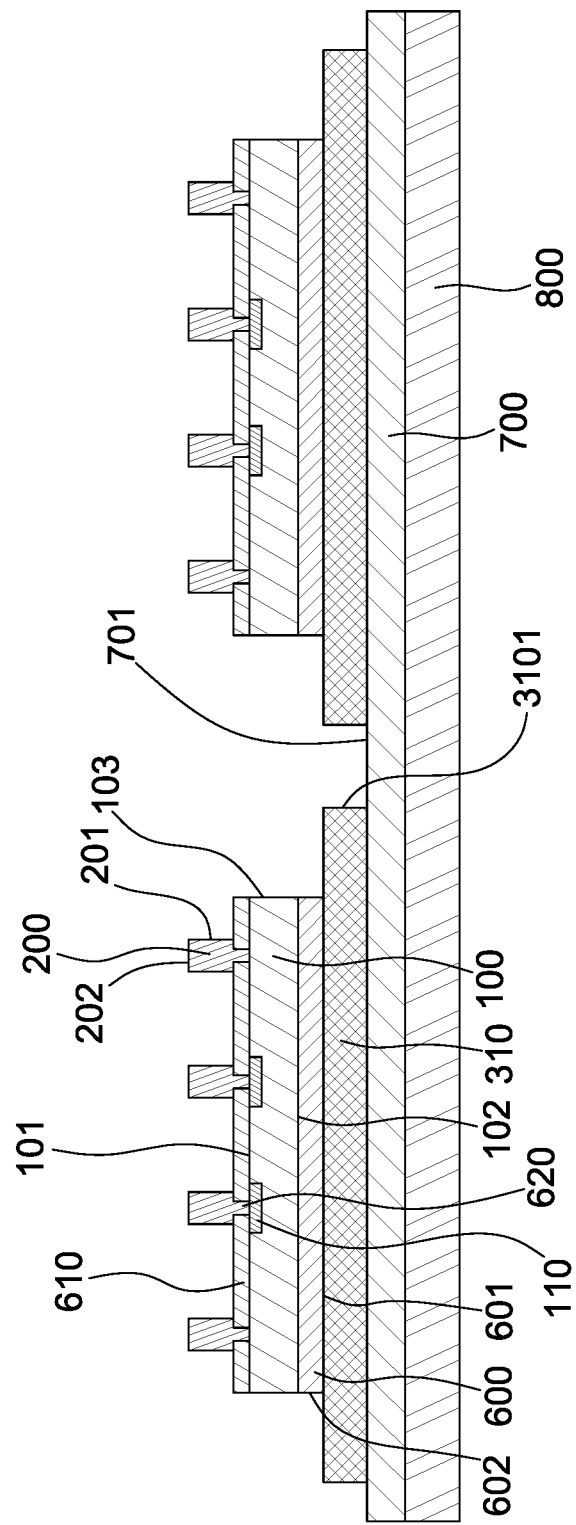

Referring to FIG. 8C, the electronic components 100 are disposed on a substrate 700 (or a carrier). In some embodiments, each of the electronic components 100 is disposed on each of the shielding layers 310. In some embodiments, the shielding layers 310 are formed on the carrier 800 prior to disposing the plurality of electronic components 100.

Figure 8D:
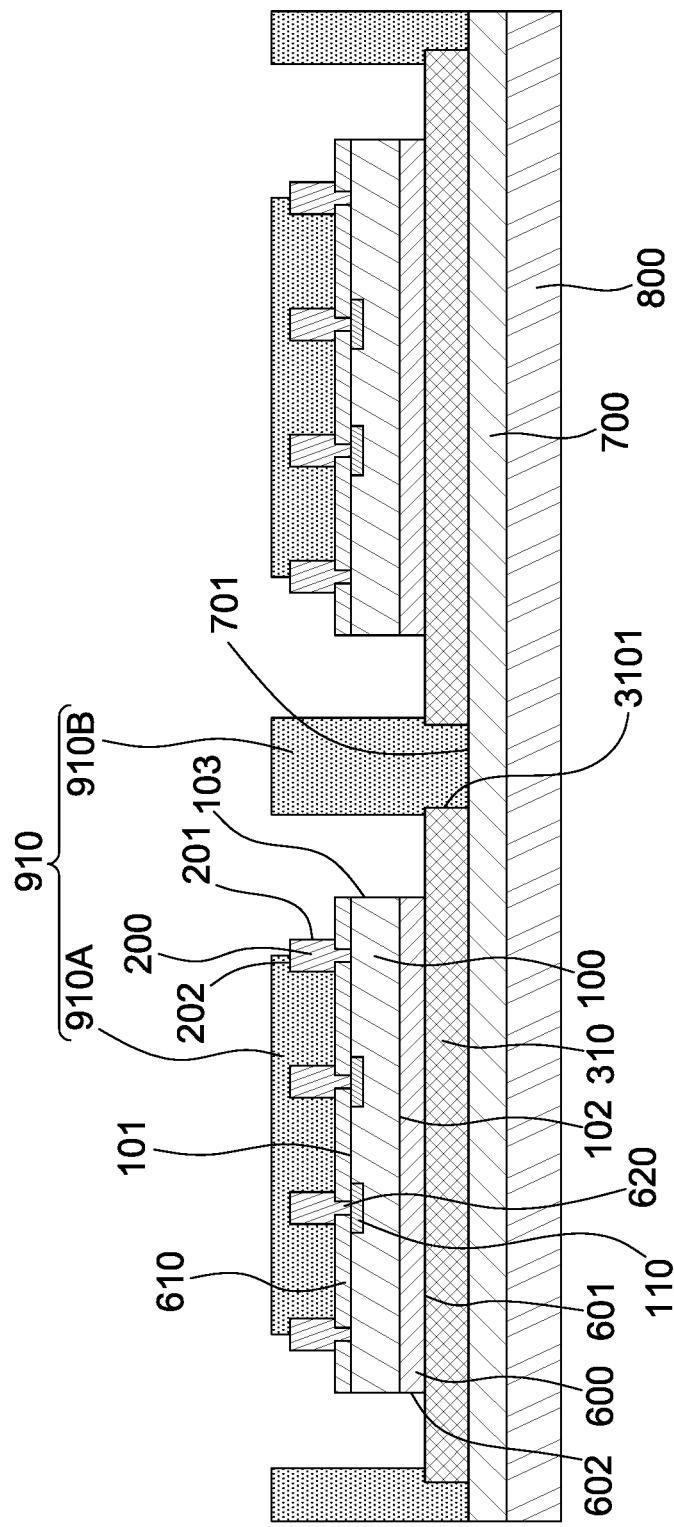

Referring to FIG. 8D, a patterned mask 910 (also referred to as "a mask") is provided over the electronic components 100 and exposing a portion of the conductive contact 200. In some embodiments, the patterned mask 910 includes portions 910A and 910B. In some embodiments, the patterned mask 910 include at least one opening exposing a portion of the conductive contact 200 and covering another portion of the conductive contact 200. In some embodiments, the opening of the patterned mask 910 is defined by the portions 910A and 910B. In some embodiments, the portion 910A partially covers the conductive contact 200 and exposes a portion of the insulating layer 610. In some embodiments, the portion 910B covers a portion of a surface 701 of the substrate 700 exposed between two adjacent electronic components 100. In some embodiments, the portion 910B covers a portion of a surface 701 of the substrate 700 exposed between two adjacent shielding layers 310. In some other embodiments, the patterned mask 910 may be free from the portion 910B, and the portion of the surface 701 exposed between two adjacent electronic components 100 is not covered by the patterned mask 910. In some other embodiments, the patterned mask 910 may be free from the portion 910B, and the portion of the surface 701 exposed between two adjacent shielding layers 310 is not covered by the patterned mask 910. In some embodiments, the patterned mask 910 may be free from the portion 910B, and the opening of the patterned mask 910 is defined by the portions 910A.

Figure 8E:
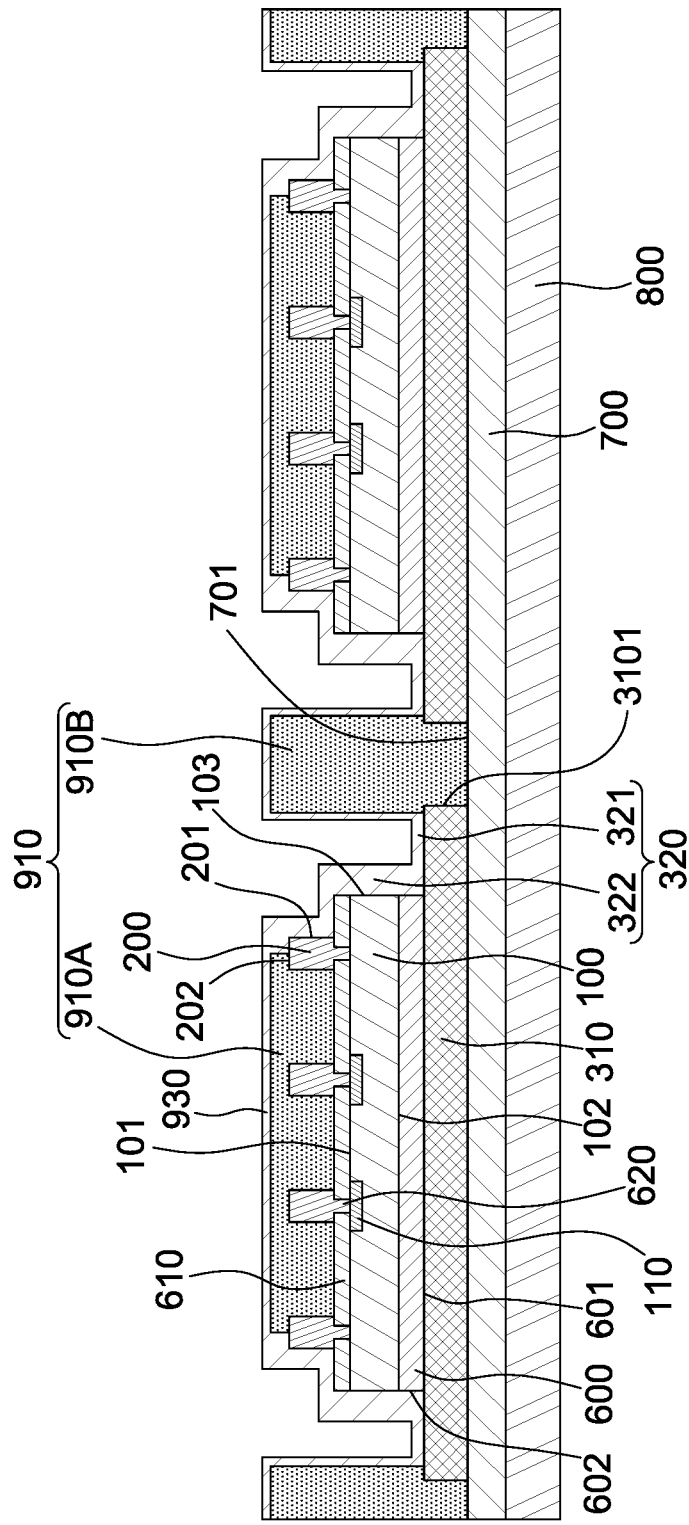

Referring to FIG. 8E, a shielding material 930 is formed on the patterned mask 910 and the portion of the conductive contact 200 exposed from the patterned mask 910 (e.g., exposed from the opening(s) of the patterned mask 910). The shielding material 930 may be formed by sputtering. In some embodiments, the shielding material 930 covers the portions 910A and 910B of the patterned mask 910. In some other embodiments, the patterned mask 910 may be free from the portion 910B, and the shielding material 930 covers a portion of the surface 701 exposed between two adjacent electronic components 100. In some other embodiments, the patterned mask 910 may be free from the portion 910B, and the shielding material 930 covers a portion of the surface 701 exposed between two adjacent shielding layers 310. According to some embodiments of the present disclosure, the position(s) of the opening(s) of the patterned mask 910 may be adjusted according to the positions of the conductive contacts 200, and thus the formation of the shielding layer 320 may not be adversely affected by the shift or rotation in positions of the conductive contacts 200 after the electronic components 100 are bonded to the substrate 700. In addition, by adjusting the position(s) of the opening(s) of the patterned mask 910, the contact area of each of the conductive contacts 200 and the shielding layer 320 can be adjusted according to the purpose of each of the conductive contacts 200. For example, the conductive contact 200 serving as a grounding terminal contacts the shielding layer 320, and the conductive contact 200 serving as a signal I/O terminal is free of any contact area with the shielding layer 320.

Figure 8F:
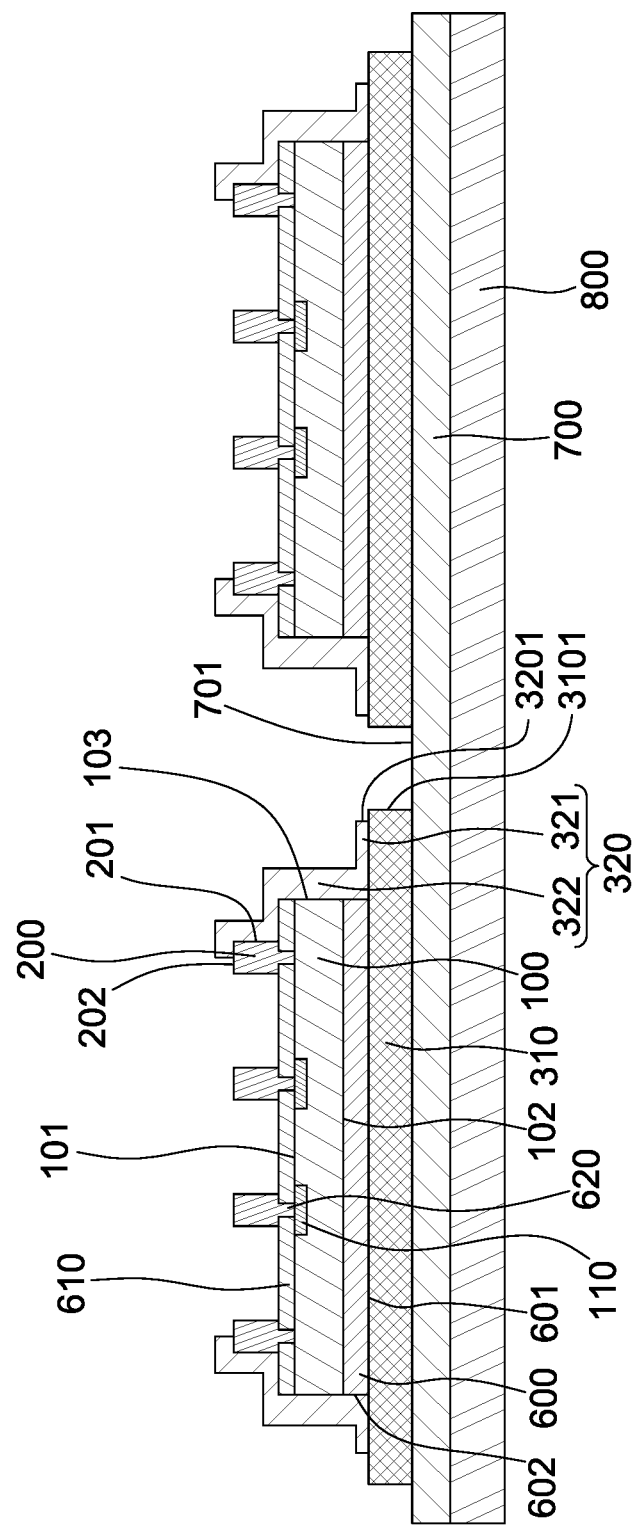

Referring to FIG. 8F, the patterned mask 910 and a portion of the shielding material 930 on the patterned mask 910 are removed. The patterned mask 910 and the portion of the shielding material 930 on the patterned mask 910 may be removed by a lift-off process. The remained shielding material 930 forms a shielding layer 320 on the conductive contact 200, the surface 101 and a lateral surface 103 of each of the electronic components 100. In some embodiments, each of the shielding layers 320 is further formed on each of the shielding layers 310. In some embodiments, the shielding layers 320 on adjacent shielding layers 310 are spaced apart from each other. In some other embodiments, the patterned mask 910 is free from the portion 910B, the shielding material 930 covers a portion of the surface 701 exposed between two adjacent shielding layers 310, and the as-formed shielding layer 320 covers the portion of the surface 701 exposed between two adjacent shielding layers 310. In some other embodiments, a portion of the shielding layer 320 contacts a portion of the surface 701 exposed between two adjacent shielding layers 310.

Figure 8G:
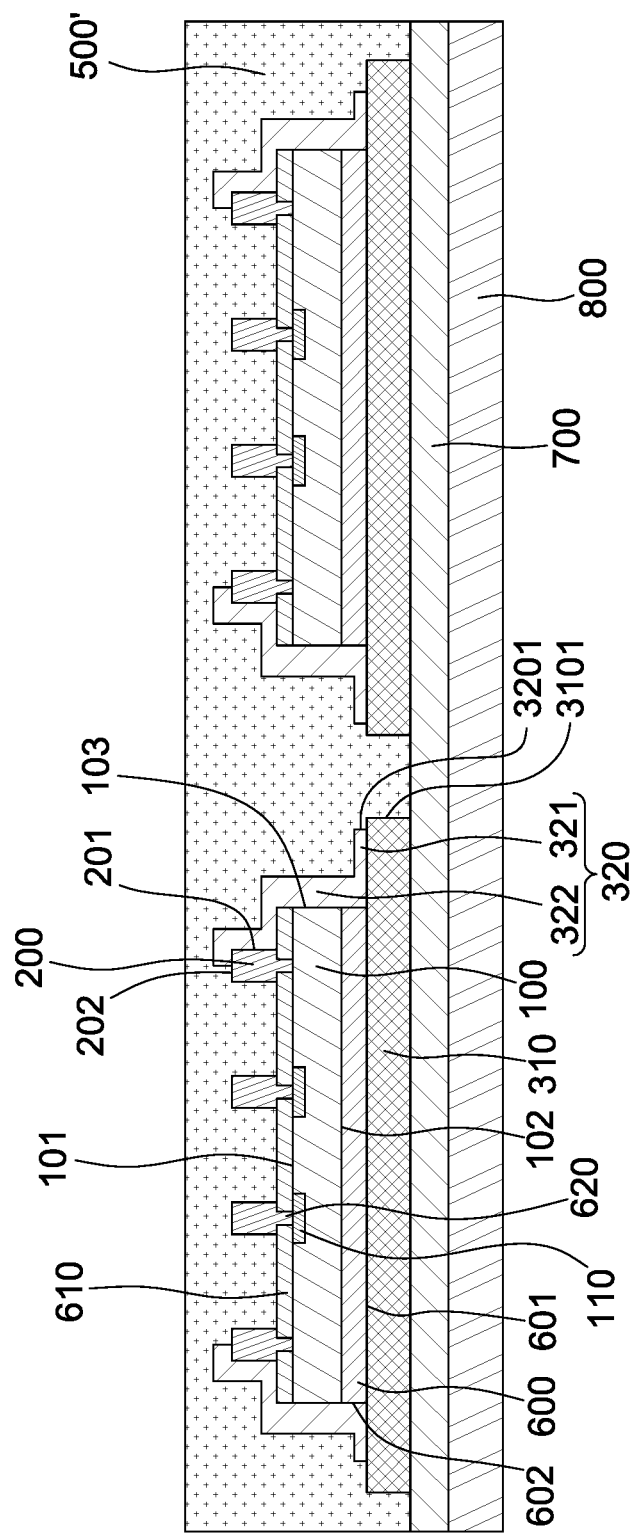

Referring to FIG. 8G, a molding compound 500' is formed to cover the shielding layers 310 and 320.

Figure 8H:
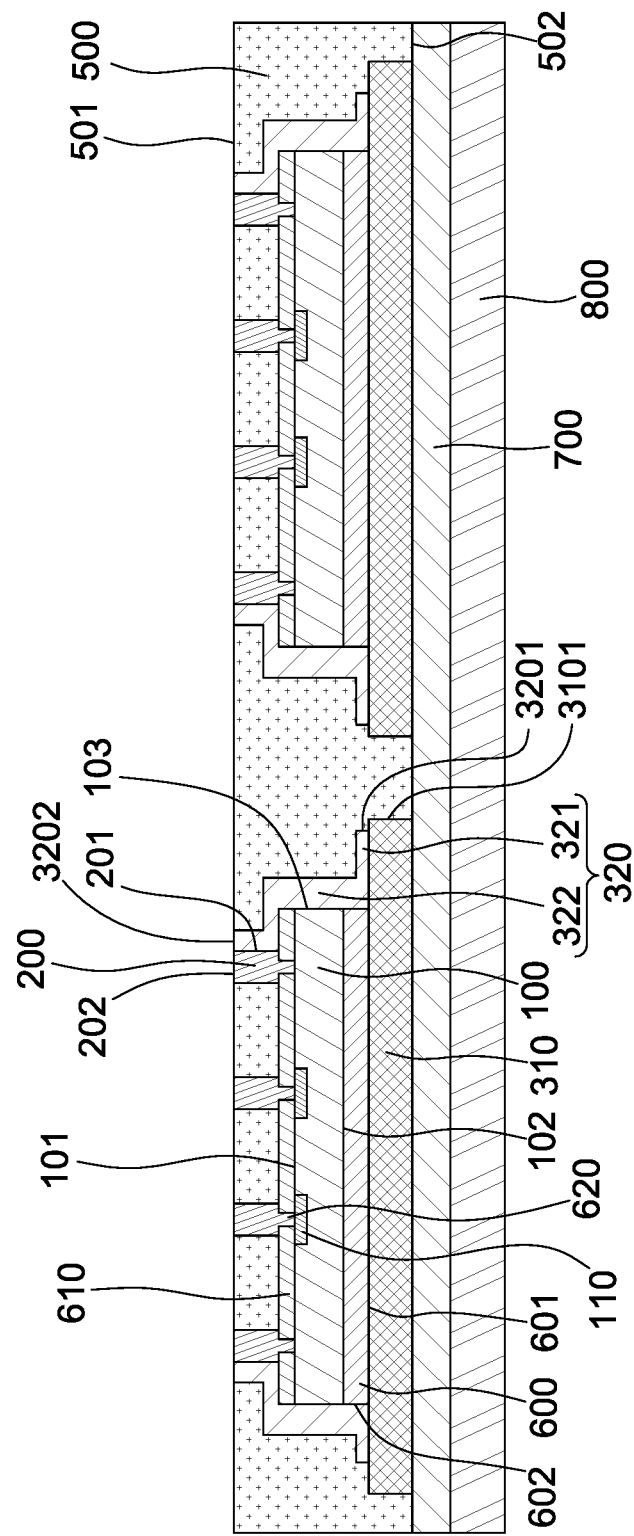

Referring to FIG. 8H, a portion of the molding compound 500' and a portion of the shielding layer 310 are removed to expose the shielding layer 310 from the molding compound 500. In some embodiments, the portion of the molding compound 500' and the portion of the shielding layer 310 may be removed by a grinding process or a polishing process.

Figure 8I:
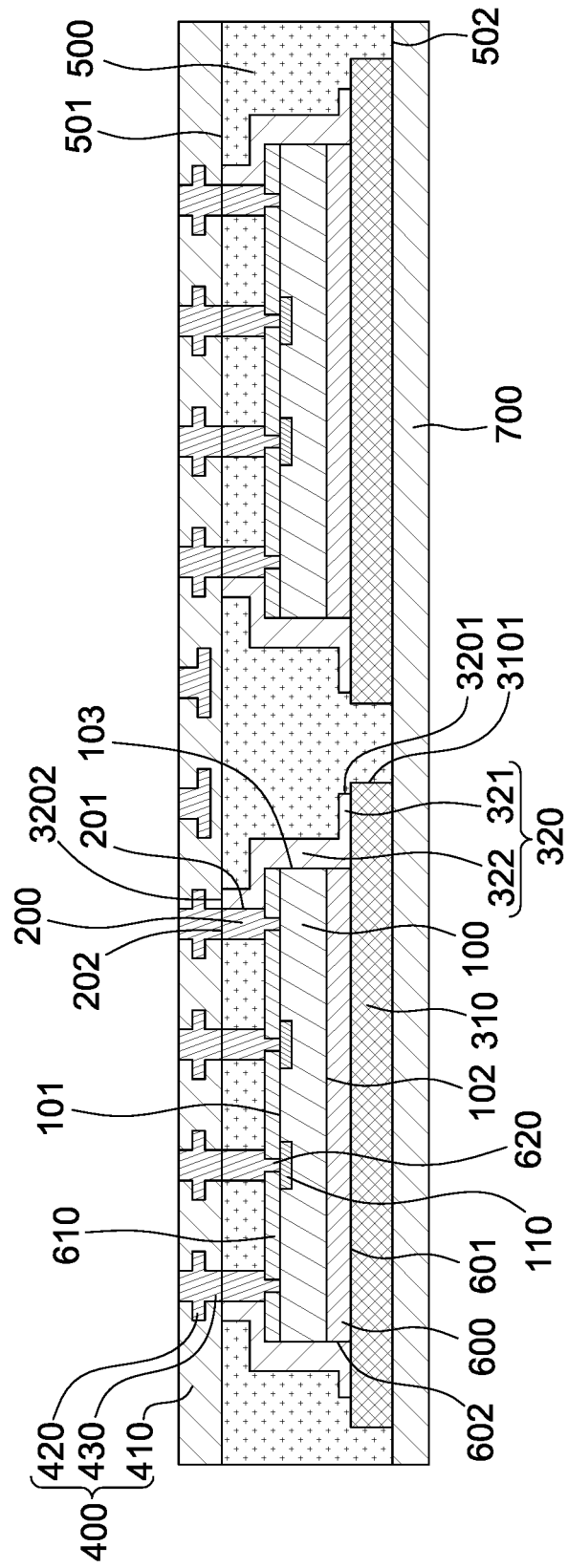

Referring to FIG. 8I, the carrier 800 is removed, and a redistribution layer 400 is formed in contact with the shielding layer 320. In some embodiments, the molding compound 500' is formed prior to forming the redistribution layer 400. In some embodiments, a portion of the molding compound 500' and a portion of the shielding layer 310 are removed to expose the shielding layer 310 from the molding compound 500 prior to forming the redistribution layer 400. In some embodiments, the carrier 800 is removed prior to forming the redistribution layer 400.

Next, referring FIG. 1, connecting elements 710 are formed on redistribution layer 400. As such, the semiconductor package structure 10 shown in FIG. 1 is formed. In some embodiments, a singulation operation may be performed on the redistribution layer 400 and the molding compound 500 to separate the electronic components 100.

FIG. 9A, FIG. 9B, FIG. 9C, FIG. 9D, FIG. 9E and FIG. 9F illustrate various operations in a method of manufacturing a semiconductor package structure 10 in accordance with some embodiments of the present disclosure.

Figure 9A:
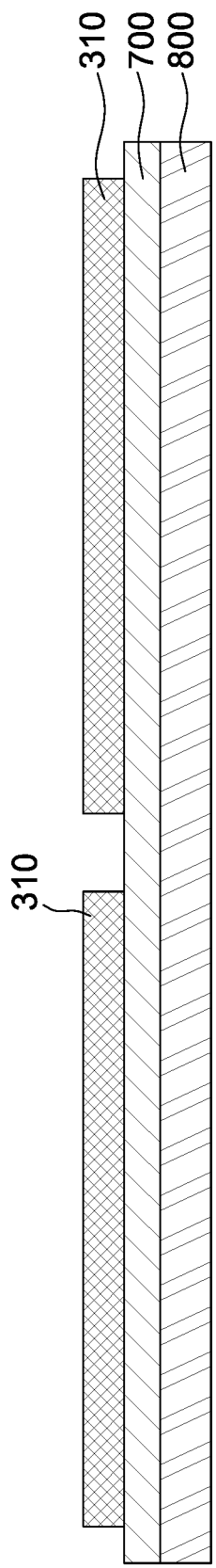
FIG. 9A, FIG. 9B, FIG. 9C, FIG. 9D, FIG. 9E and FIG. 9F illustrate various operations in a method of manufacturing a semiconductor package structure in accordance with some embodiments of the present disclosure.
Figure 9B:
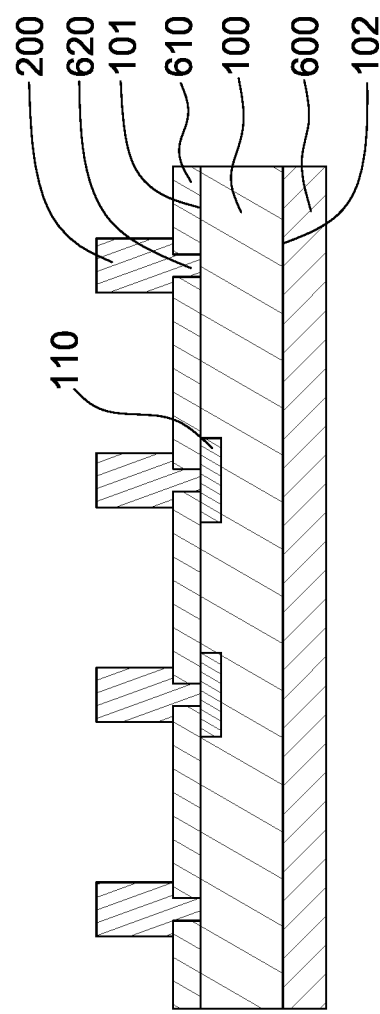
Figure 9C:
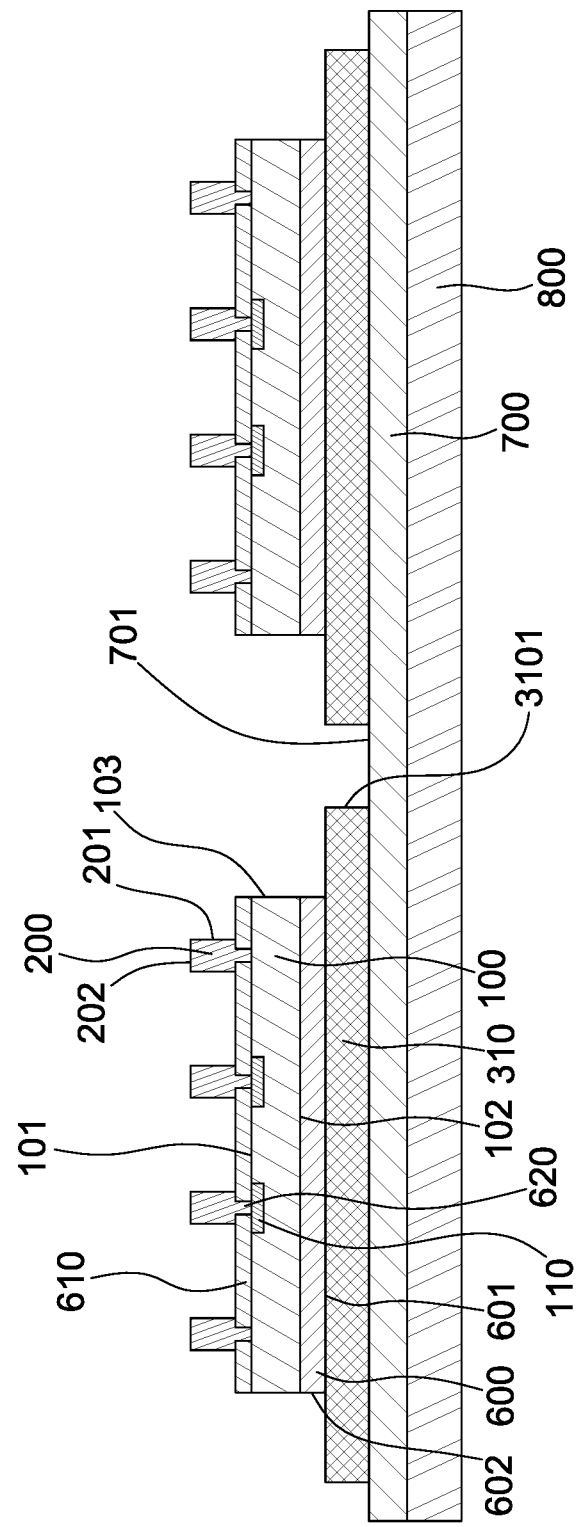

Referring to FIGS. 9A-9C, operations similar to those illustrated in FIGS. 8A-8C are performed to form a structure shown in FIG. 9C.

Figure 9D:
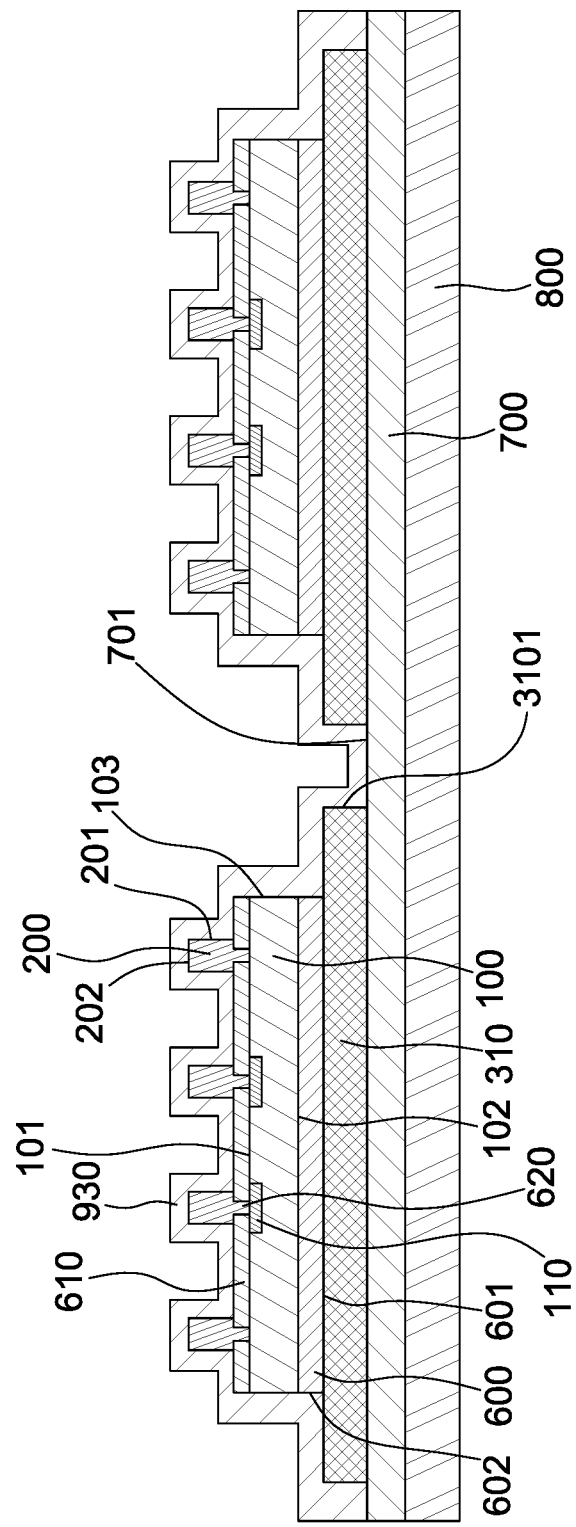

Referring to FIG. 9D, a shielding material 930 is formed on the electronic components 100. The shielding material 930 may be formed by sputtering.

Figure 9E:
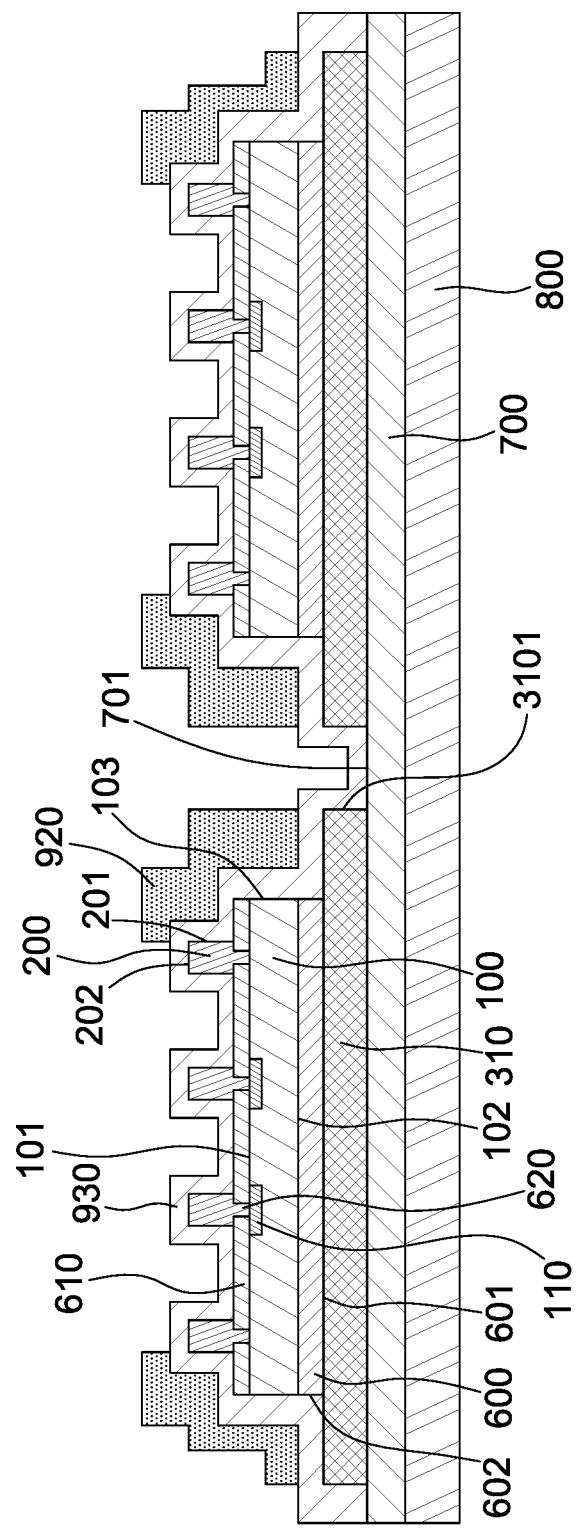

Referring to FIG. 9E, a patterned mask 920 is formed over the electronic components 100 and exposing a portion of the shielding material 930. In some embodiments, a projection of the patterned mask 920 overlaps a portion of the conductive contact 200. In some embodiments, a portion of the shielding material 930 is exposed from the patterned mask 920. In some embodiments, a portion of the shielding material 920 between two adjacent shielding layers 310 is exposed from the patterned mask 920.

Figure 9F:
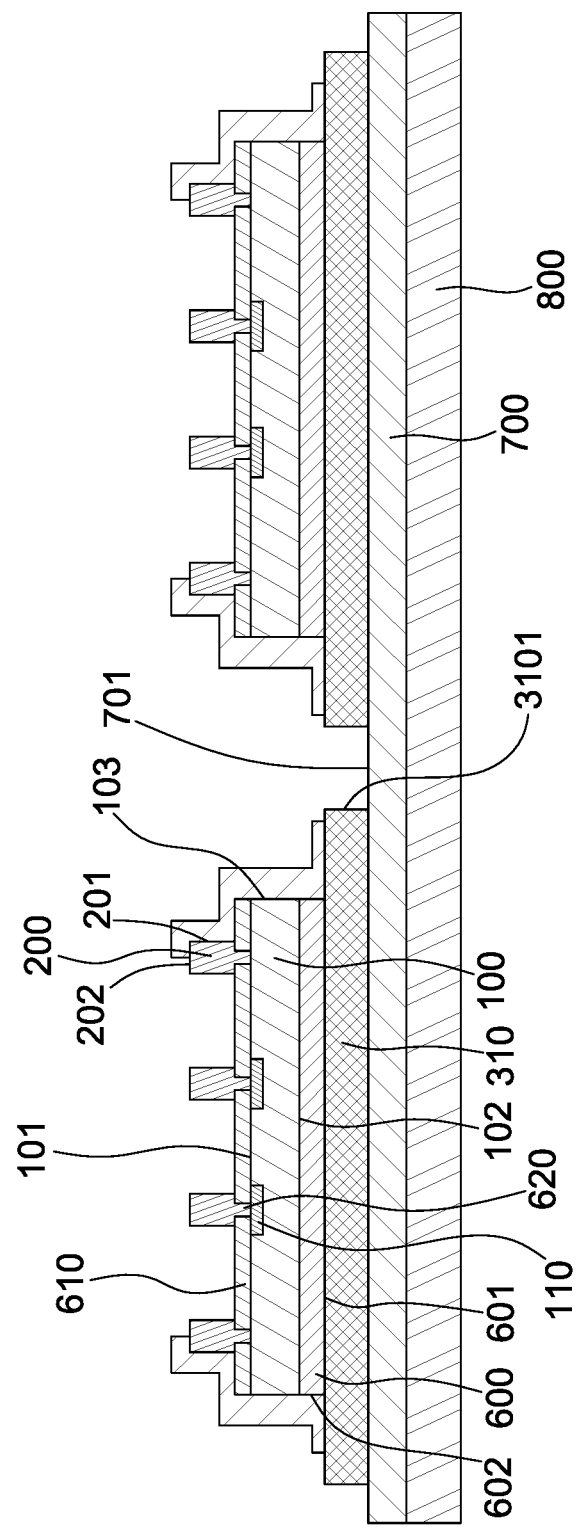

Referring to FIG. 9F, the portion of the shielding material 930 exposed from the patterned mask 920 is removed, and the patterned mask 920 is removed. In some embodiments, the shielding material 930 includes two layers made of different materials (e.g., a Cu layer and a Ti layer), and two etching processes are performed to respectively remove the two layers.

Next, operations similar to those illustrated in FIGS. 8G-8I are performed on the structure shown in FIG. 9F, and connecting elements 710 are formed on redistribution layer 400. As such, the semiconductor package structure 10 shown in FIG. 1 is formed.

According to some embodiments of the present disclosure, the shielding layer is disposed on the lateral surface of the electronic component and contacts the conductive contact, and thus a chip scale shielding layer may be formed on individual electronic components to connect to a grounding terminal. Therefore, failure of contact between the shielding layer and the conductive contact can be effectively prevented, and the reliability and the electrical performance of the semiconductor package structure can be enhanced. In addition, according to some embodiments of the present disclosure, the shielding layer may be formed without being subjected to an alignment operation and/or a cutting operation, thus the profile of the shielding layer can be prevented from being adversely affected by the aforesaid alignment operation and/or cutting operation, and an extra space saved for the processing tolerance for the cutting operation can be omitted. Therefore, the electrical performance of the semiconductor package structure can be enhanced, and the size of the semiconductor package structure can be reduced.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
an electronic component having a first surface, a lateral surface adjacent to the first surface, and a second surface opposite to the first surface;
a conductive contact connected to the first surface of the electronic component;
a first shielding layer disposed on the lateral surface of the electronic component and a portion of the first surface of the electronic component, the first shielding layer contacting the conductive contact; and
an encapsulant encapsulating the electronic component, the conductive contact, and the first shielding layer;
wherein a surface of the encapsulant and a surface of the conductive contact are substantially coplanar.

2. The semiconductor package structure as claimed in claim 1, further comprising:
a redistribution layer on the conductive contact and the surface of the encapsulant.

3. The semiconductor package structure as claimed in claim 2, wherein a surface of the first shielding layer is exposed from the encapsulant.

4. The semiconductor package structure as claimed in claim 3, wherein the surface of the encapsulant, the surface of the conductive contact and the surface of the first shielding layer are substantially coplanar.

5. A semiconductor package structure, comprising:
an electronic component having a first surface, a lateral surface adjacent to the first surface, and a second surface opposite to the first surface;
a conductive contact connected to the first surface of the electronic component;
a first shielding layer disposed on the lateral surface of the electronic component and a portion of the first surface of the electronic component, the first shielding layer contacting the conductive contact; and
a second shielding layer on the second surface of the electronic component and in contact with the first shielding layer.

6. The semiconductor package structure as claimed in claim 5, wherein the first shielding layer comprises a first portion connected to the second shielding layer, and an edge of the second shielding layer and an edge of the first portion of the first shielding layer are discontinuous.

7. The semiconductor package structure as claimed in claim 6, wherein the edge of the first portion of the first shielding layer is recessed from the edge of the second shielding layer.

8. The semiconductor package structure as claimed in claim 6, wherein the first shielding layer comprises a second portion contacting the conductive contact and angled with the first portion of the first shielding layer.

9. The semiconductor package structure as claimed in claim 5, further comprising:
an adhesive layer between the second shielding layer and the second surface of the electronic component.

10. The semiconductor package structure as claimed in claim 9, wherein the first shielding layer contacts the adhesive layer.

11. The semiconductor package structure as claimed in claim 9, wherein the second shielding layer comprises a plurality of openings, and a portion of the adhesive layer is disposed in the openings.

12. A semiconductor package structure, comprising:
an electronic component having a first surface, a lateral wall having a lateral surface adjacent to the first surface, and a second surface opposite to the first surface;
a conductive contact connected to the first surface of the electronic component; and
a first shielding layer disposed on the lateral surface of the electronic component and a portion of the first surface of the electronic component, the first shielding layer contacting the conductive contact;
wherein the first shielding layer comprises an opening exposing a portion of the lateral wall of the electronic component from a top view perspective.

13. The semiconductor package structure as claimed in claim 12, further comprising an encapsulant encapsulating the electronic component, wherein at least a portion of the encapsulant is within the opening of the first shielding layer.

14. A semiconductor package structure, comprising:
a plurality of electromagnetic-sensitive devices;
a first EMI shielding layer encapsulating a first electromagnetic-sensitive device of the plurality of electromagnetic-sensitive devices;
a second EMI shielding layer encapsulating a second electromagnetic-sensitive device of the plurality of electromagnetic-sensitive devices;
an encapsulant encapsulating the first electromagnetic-sensitive device and the second electromagnetic-sensitive device; and
a redistribution layer disposed on the encapsulant and crossing the first electromagnetic-sensitive device and the second electromagnetic-sensitive device to electrically connect the first electromagnetic-sensitive device and the second electromagnetic-sensitive device,
wherein a lateral surface of the first electromagnetic-sensitive device is adjacent to a lateral surface of the second electromagnetic-sensitive device, and the lateral surface of the first electromagnetic-sensitive device and the lateral surface of the second electromagnetic-sensitive device are non-parallel from a top view perspective.

15. A semiconductor package structure, comprising:
an electronic component having a first surface, a lateral surface adjacent to the first surface, and a second surface opposite to the first surface;
a conductive contact connected to the first surface of the electronic component;
a shielding layer disposed on the lateral surface of the electronic component and a portion of the first surface of the electronic component, the first shielding layer contacting the conductive contact, wherein the first shielding layer comprises a plurality of segments, and the plurality of segments comprise a first segment in contact with the conductive contact and a second segment spaced apart from the conductive contact; and
a redistribution layer over the conductive contact, wherein the second segment of the shielding layer is physically separated from the redistribution layer, and the first segment of the shielding layer is in contact with the redistribution layer.

* * * * *